United States Patent
Labbe

(10) Patent No.: US 11,646,740 B2
(45) Date of Patent: May 9, 2023

(54) CIRCUITS AND METHODS TO ALTER A PHASE SPEED OF AN OUTPUT CLOCK

(71) Applicant: Arm Limited, Cambridge (GB)

(72) Inventor: Benoit Labbe, Cambridge (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/366,904

(22) Filed: Jul. 2, 2021

(65) Prior Publication Data

US 2023/0006678 A1    Jan. 5, 2023

(51) Int. Cl.
*H03L 7/081* (2006.01)
*G01R 31/317* (2006.01)

(52) U.S. Cl.
CPC ........ *H03L 7/081* (2013.01); *G01R 31/31709* (2013.01)

(58) Field of Classification Search
CPC ............................ H03L 7/081; G01R 31/31709
See application file for complete search history.

(56) References Cited

U.S. PATENT DOCUMENTS

| | | | |
|---|---|---|---|
| 2004/0183613 A1* | 9/2004 | Kurd | G01K 7/32 331/186 |
| 2012/0187991 A1* | 7/2012 | Sathe | H03K 5/135 327/158 |
| 2018/0284828 A1* | 10/2018 | Mosalikanti | H03L 7/093 |
| 2021/0240142 A1* | 8/2021 | Bang | G05B 11/42 |
| 2022/0166436 A1* | 5/2022 | Labbe | G06F 1/28 |

* cited by examiner

*Primary Examiner* — Adam D Houston
(74) *Attorney, Agent, or Firm* — Pramudji Law Group PLLC; Ari Pramudji

(57) ABSTRACT

In a particular implementation, a method to reduce noise/clock jitter and to generate a "stretched" output clock to optimize for jitter of the output clock is disclosed. The method includes: generating two or more clock phases upon detecting a transient voltage by a detector circuit, generating an output clock signal based on one of the two or more clock phases; and altering a phase speed of the output clock signal to correspond to a phase speed of an input clock signal.

19 Claims, 8 Drawing Sheets

CIRCUITS AND METHODS TO ALTER A PHASE SPEED OF AN OUTPUT CLOCK

I. FIELD

The present disclosure is generally related to circuit and methods to alter a phase speed of an output clock.

II. DESCRIPTION OF RELATED ART

Advances in technology have resulted in smaller and more powerful computing devices. For example, a variety of portable personal computing devices, including wireless telephones, such as mobile and smart phones, tablets and laptop computers are small, lightweight, and easily carried by users. These devices can communicate voice and data packets over wireless networks. Further, many such devices incorporate additional functionality, such as a digital still camera, a digital video camera, a digital recorder, and an audio file player. Also, such devices can process executable instructions, including software applications, such as a web browser application, that can be used to access the Internet. As such, these devices can include significant computing and networking capabilities. Nevertheless, there is an ever increasing need for computing devices to run faster and/or with consuming less power.

In one example, due to various timing failures, extraneous jitter (i.e., added noise) at the output of a digital system can be a significant issue in adaptive clocking circuits. In certain operations, a delayed locked loop (DLL) would add clock jitter to an input jitter of a master clock. Accordingly, each output phase of the DLL would be "noisier" than the input clock signal. Such added jitter cannot be filtered by a shifter circuit. Hence, there is a need in the art, to provide for adaptive clocking systems, circuits and methods to account for extraneous jitter, and keep it as low as possible, such that digital systems may run faster and/or with consuming less power.

III. BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, circuits or apparatuses described herein.

Figure 1:
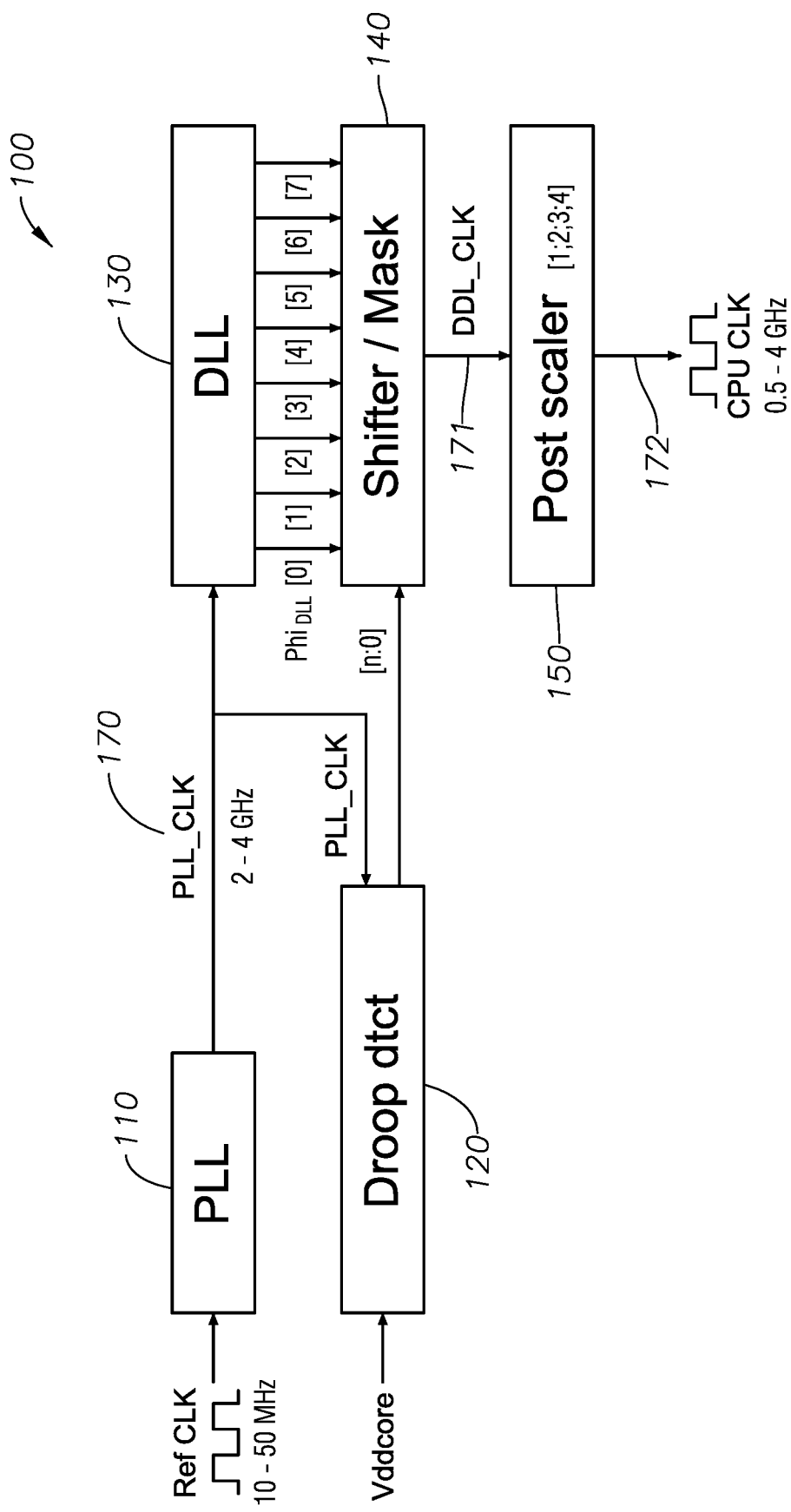
FIG. 1 is a schematic diagram implementable with example circuits and methods.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

IV. DETAILED DESCRIPTION

According to one implementation of the present disclosure, a method to reduce noise/clock jitter and to generate a "stretched" output clock to optimize for jitter of the output clock is disclosed. The method includes: generating two or more clock phases upon detecting a transient voltage by a detector circuit, generating an output clock signal based on one of the two or more clock phases; and altering a phase speed of the output clock signal to correspond to a phase speed of an input clock signal.

According to another implementation of the present disclosure, a circuit to reduce noise/clock jitter and to generate a "stretched" output clock to optimize for jitter of the output clock is disclosed. The circuit includes: a detector circuit to monitor a supply voltage for a transient voltage; upon detection of the transient voltage, an input phase circuit configured to generate two or more clock phases; a phase selector configured to generate an output clock signal from at least one of the two or more clock phases; and a speed controller circuit configured to alter a phase speed of the output clock signal to correspond to a phase speed of an input clock signal.

According to another implementation of the present disclosure, a speed controller circuit to allow for the capacity to reduce noise/clock jitter and generate a "stretched" output clock to optimize for jitter of the output clock is disclosed. The speed controller circuit may include: an OR logic gate; a NOR logic gate; an AND logic gate; and a multiplexer. The speed controller circuit can be configured to determine whether an input signal from a detector circuit comprises a voltage level above a voltage threshold, and whether a selected phase speed is above a phase speed threshold.

Particular implementations of the present disclosure are described below with reference to the drawings. In the description, common features are designated by common reference numbers throughout the drawings.

Advantageously, inventive schemes and techniques provide for adaptive clocking circuitry to dynamically adjust a clock frequency of a digital system to respond to a supply voltage perturbation (i.e., a detected transient voltage, a noise signal). For example, in certain implementations, when a voltage droop is detected, inventive aspects allow for the capacity to "carry on shifting" (i.e., altering a phase speed) to a least noisy clock phase instead of "staying" on a random clock phase.

As one advantage, upon detection of a droop voltage, inventive speed controller circuitry provides for the capability to slow down an output clock, such that the output clock "stretches" (and thus, the output clock's frequency is less than a frequency of the base clock).

Referring to FIG. 1, a fine-grained adaptive clocking circuit 100 (i.e., system 100) is shown. A master clock 170 (PLL_CLK) (e.g., 2-4 GHz) can be transmitted to the circuit 100 (as one example, from a Phase Locked Loop (PLL)) 110 and provide a clock signal 170 (PLL_CLK) for a droop detector 120 (droop_dtct) to monitor a supply voltage (Vdd_core) of a larger digital circuit (i.e., digital system). In an example, the digital system (not shown) would receive the adaptive clocking output clock 172 CPU_CLK (e.g., approximately 0.5 to 4 GHz).

In certain implementations, a delayed locked loop (DLL) 130 can be configured to generate two or more (e.g., several) phases (i.e., DLL phases) from the PLL 110 to be transmitted to a phase selector circuit 140 (i.e., phase shifter). As illustrated in FIG. 1, in one example, the DLL circuit 130 is configured to receive the master clock 170 (PLL_CLK), and output eight phases, $Phi_{DLL}$ [0] to [7] (i.e., DLL phases). The phase selector circuit (i.e., shifter/mask) 140, in turn, can be configured to generate a composite clock signal 171 (DDL_CLK) from the DLL phases. In one implementation, the composite clock signal 171 may be transmitted to a post scaler circuit 150 to generate the adaptive clocking output clock 172 (CPU_CLK).

Figure 2:
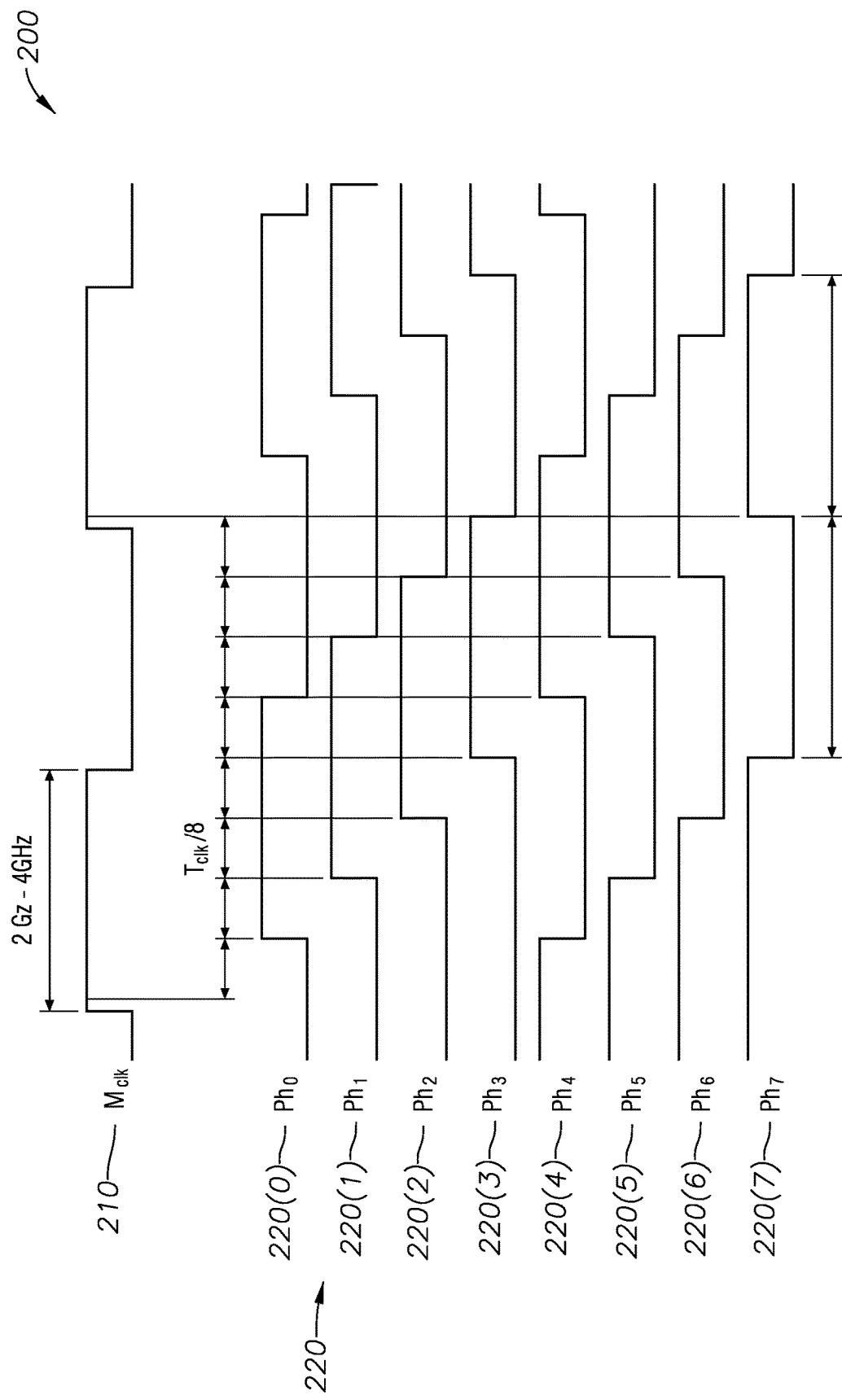
FIG. 2 is a schematic diagram implementable with example circuits and methods.

Referring to FIG. 2, example input and output signals of the DLL circuit 130 of FIG. 1 is shown. One input signal 210 is depicted as $M_{clk}$, and eight different prospective output clock signals (i.e., output phases, output clock phases) 220 (e.g., 220(a)-(h)) is depicted as $Ph_0$ to $Ph_7$. In one example implementation, one period (T) of the clock can be divided into 8 segments (i.e., each of different delays). As illustrated, the rising edge of each of the output phases 220(a)-220(h) correspond to each of the eight segments. In a particular operation, the phase selector circuit 140 would generate a rising edge of an output clock 172, CPU_CLK, utilizing one of the DLL output phases 220(a)-220(h). For example, the chosen phase would be randomly selected by a shifting operation when an adaptative clocking mechanism would be triggered (e.g., upon detection of a transient voltage on $V_{DD}$). For example, the chosen phase would be randomly selected by the phase selector circuit (140) after triggering (e.g., upon detection of a transient voltage on $V_{DD}$) of one or more adaptive clocking mechanism (e.g., to shift between the output clock phases)."

However, such an operation would be suboptimal as the jitter of the output clock 172 CPU_CLK can be as high as the jitter of the chosen phase of the DLL circuit 130. Accordingly, this jitter would also have to be taken into account in digital circuit designs that receive, the output clock 172 CPU_CLK, as well as added to a timing margin as part of clock uncertainty. As an example, if phase 7 of an 8-phase DLL would present a worst-case minimum period jitter of 5 picoseconds (ps), then 5 ps must also be added to the timing margining during digital circuit design.

Advantageously, the inventive aspects take into account that in the DLL circuit 133, the phase "noise" (e.g., clock jitter) would increase with subsequent delay through a provided delay line (i.e., each additional segment of the period). Hence, each subsequent phase would be "noisier" than the preceding phase (e.g., phase "7" would be noisier than phase "6", phase "6" would be noisier than phase "5", etc.). As can be appreciated, the "cleanest" (i.e., least) noise would be the initial phase, phase "0", which for example, may be close to (e.g., approximately equal to) a noise of level of the input clock, PLL_CLK 170.

Figure 3:
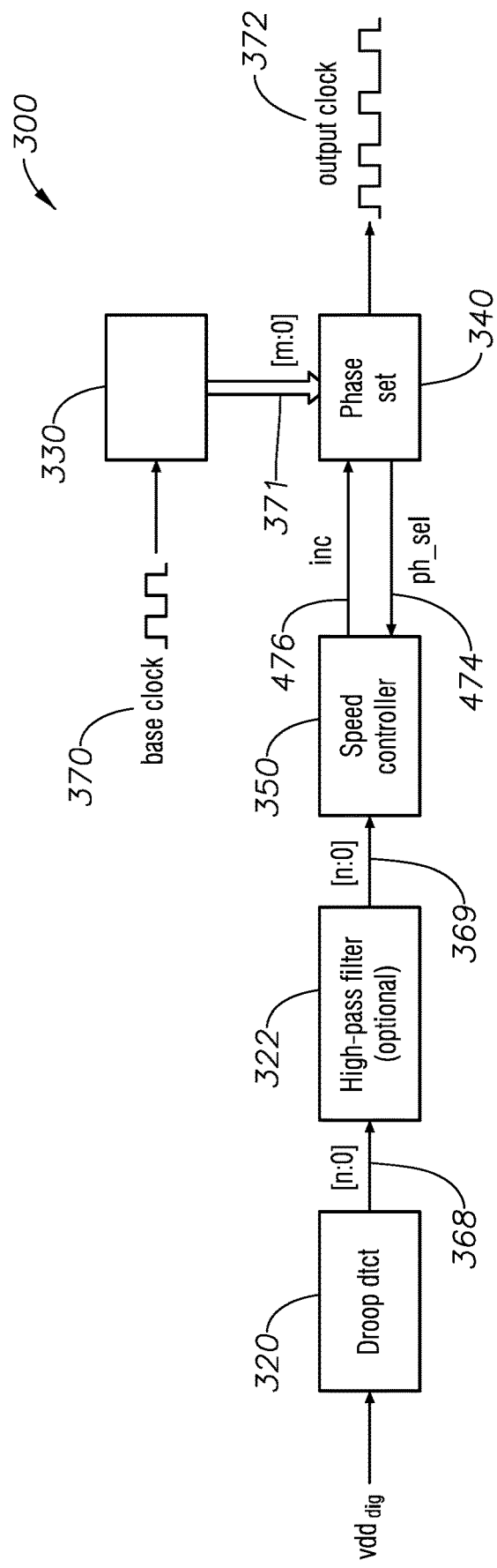
FIG. 3 is a schematic block diagram implementable with example circuits and methods.

Referring to FIG. 3, a block diagram of an adaptative clocking circuit 300 (i.e., system 300) according to example implementations is shown. As illustrated, the circuit 300 includes a detector circuit 310, an input phase circuit 330, a phase selector circuit 340, a speed controller circuit 320. In certain implementations, the detector circuit 310 comprises a droop detector circuit (droop_dtct) that can be configured to monitor a supply voltage (Vdd) for an indication of a transient voltage, and output a detection signal 368 (i.e., [n:0], droop) to the speed controller circuit 350. In some implementations, the detection signal 368 may be transmitted to a high-pass filter circuit 322 (e.g., an analog-to-digital converter) before a filtered detection signal 369 is transmitted to the speed controller circuit 350.

In certain operations, upon a detection of a transient voltage by the detection circuit 310, the input phase circuit 330 can be configured to generate two or more (e.g., several, a plurality) of clock phases. In some operations, the input phase circuit 330 can be configured to receive a base clock (CLK) signal, and transmit two or more (e.g., eight, a plurality of) clock phases to the phase selector circuit 330. In different implementations, the input phase circuit 330 can comprise a delayed lock loop circuit (DLL), a phased-locked loop (PLL), a frequency-locked loop (FLL) or an oscillator.

As illustrated in FIG. 3, in one example, input phase circuit 330 is configured to receive the base clock 370, and output two or more input phases (i.e., [m:0], clock phases). The phase selector circuit (i.e., shifter/mask) 340, in turn, can be configured to generate an output clock 372 from the input phases.

In some additional implementations, the circuit 300 may further include a phase-locked loop (PLL) circuit (not shown) to transmit the base clock signal 370 to the input phase circuit 330. In some implementations, the circuit 300 may further include a post scaler circuit (not shown) that is configured to receive an output clock signal 372 from the phase selector circuit 340.

In schemes and techniques as described herein, advantageously, the phase selector circuit 340 (i.e., shifter circuit) has the capacity to always settle on phase "0" of the input phase circuit 330. For example, if after a transient voltage is detected at the detection circuit 320, the phase selector circuit 340 may initially settle on phase "4", for example, at random, the phase selector circuit 340 would carry on "shifting" (i.e., altering a phase speed of) the clock signal until the phase selector circuit 340 would reach phase "0". Such an operation would occur irrespective of a droop detector signal ([n:0]) from the detection circuit 320.

For this instance, an overall penalty would delay the digital system by half a cycle. In such cases, a maximum penalty in doing so would be up to one lost cycle of CPU operation. Nevertheless, advantageously, if the input phase circuit 330 added clock jitter is 2% higher of a total clock period for a "last" input phase (e.g., DLL phase) than for an "initial" input phase (e.g., DLL phase), then the CPU may run 2% faster thank to a reduction of clock uncertainty. As such, inventive adaptive clocking circuit and methods as disclosed herein provide for circuits to run faster and/or with less power.

Figure 4:
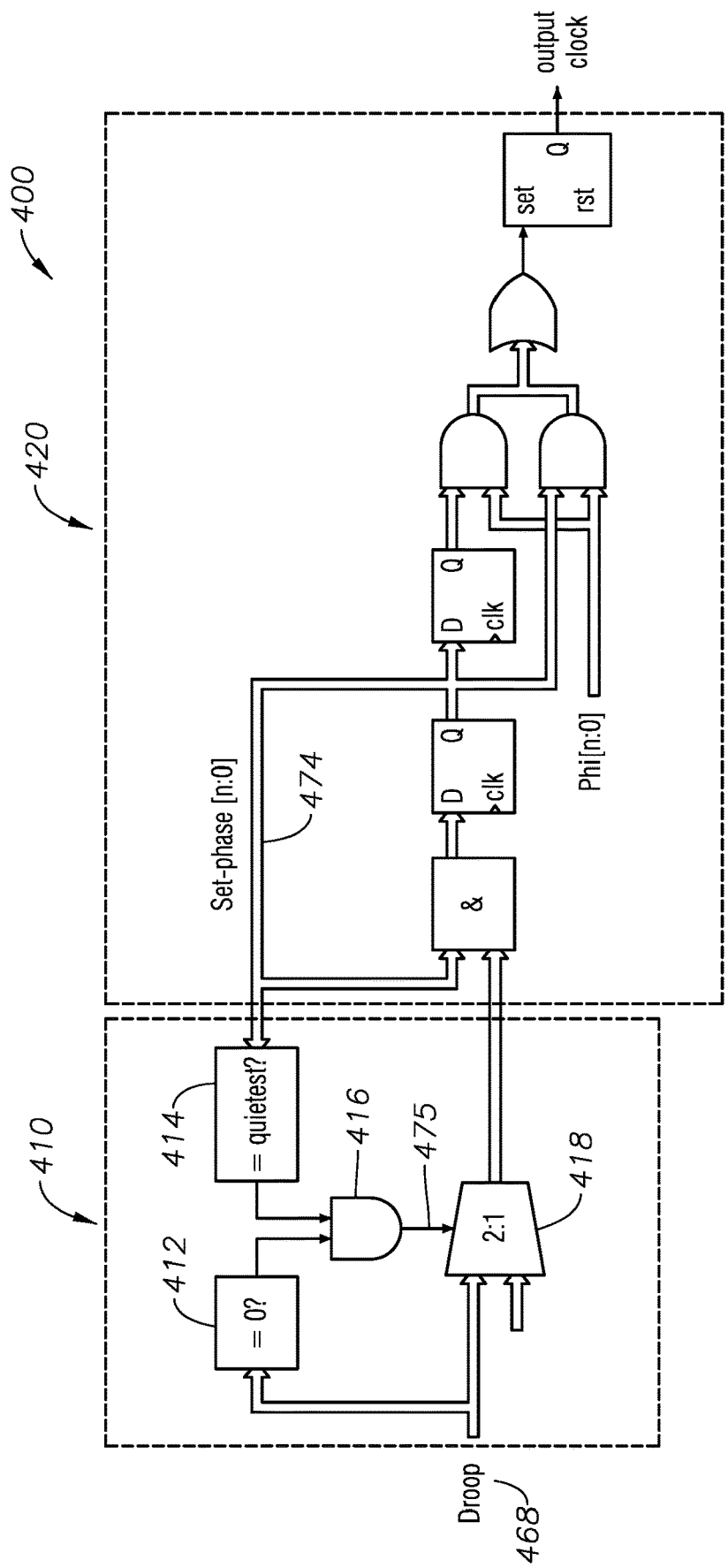
FIG. 4 is a schematic block diagram implementable with example circuits and methods.

Referring to FIG. 4, a diagram 400 of an speed controller circuit 410 (corresponding to speed controller circuit 350 in FIG. 3) and phase selector circuit 420 (corresponding to phase selector circuit 340 in FIG. 3) according to example implementations is shown. As illustrated, in an example operation, an example input droop signal 468 (i.e., a first input signal) is transmitted to the speed controller 410. At decision block 412, the speed controller 410 would determine whether the input droop signal 468 may be asserted (e.g., ==2) (i.e., whether the input droop signal 468 includes a voltage level (i.e., a transient voltage) above a voltage threshold) or not (e.g., ==0). If "yes" at the decision block 412, the input signal 468 is provided (as a digital "1") to an AND logic gate 416. In alternative implementations, other equivalent circuit structures may be utilized (e.g., two consecutive NAND logic gates). If "no" at the decision block 412, the first input signal 468 is provided as a first input (e.g., a digital "0") to multiplexer 418 (e.g., a 2 to 1 multiplexer) (i.e., a controlled switch). Also provided, from the phase selector circuit 420, is a phase selector signal 474 (i.e., a second input signal) (ph_sel as shown in FIG. 3, Setphase [n:0]) from the phase selector circuit 420. At decision block 414, the speed controller 410 would determine whether the phase selector signal 474 corresponds to (i.e., equals) the quietest phase (!=quietest) (e.g., phase "0", the least "noisy" phase would be the voltage threshold). If "yes" at the decision block 414, the second input signal 474 is provided to the AND logic gate 414. If both of the first and second inputs signal 468, 474 are "yes", a selector input 475 would transmit a digital "1" to the multiplexer 418, and the multiplexer 414 would output a digital "1" as the output signal 476 (inc as shown in FIG. 3) to the phase selector circuit 420.

In turn, in certain implementations, the phase selector circuit 420 would output the output clock signal 372 at a lower frequency than the base clock 370 until it outputs the phase of the output clock signal 371 corresponding to the "least noisy" phase. When, the least noisy phase of the clock signal 371 feeds the output clock signal 372, the decision block 414 outputs a logic "0" that in turn, would "toggle" the "AND" logic gate 416 irrespective of the output of the decision block 412. The multiplexer 418 may then output the input signal 468. If the input signal 468 is a digital "0", and the output of the decision block 414 is "0", the phase selector input signal 476 (inc) would "lock" the phase selector 420 in a current state where the output clock 372 is triggered from the least noisy phase of the clocks 371.

As one example, in operation, in response to a detection of the input droop signal 468, the speed controller 410 would slow down the output clock 372 so that the output clock 372 "stretches" and would have a frequency lower than the base clock 370. If so, the output clock 372 would have a value of 1 (e.g., as a multiple of the frequency of the base clock 370). However, as a result of voltage droop, the output clock would have a value of 0.7 or 0.8 (e.g., as a multiple of the frequency of the base clock 370). Nevertheless, as a supply voltage (Vdd) would stabilize, there would no longer be any problematic voltage droop, and hence, no droop signal would be input to the speed controller circuit 410. Correspondingly, the system 300 can return to a "normal" state where the frequency of the output clock 372 corresponds to (i.e., is approximately equivalent to) the frequency of the base clock 370.

Figure 5:
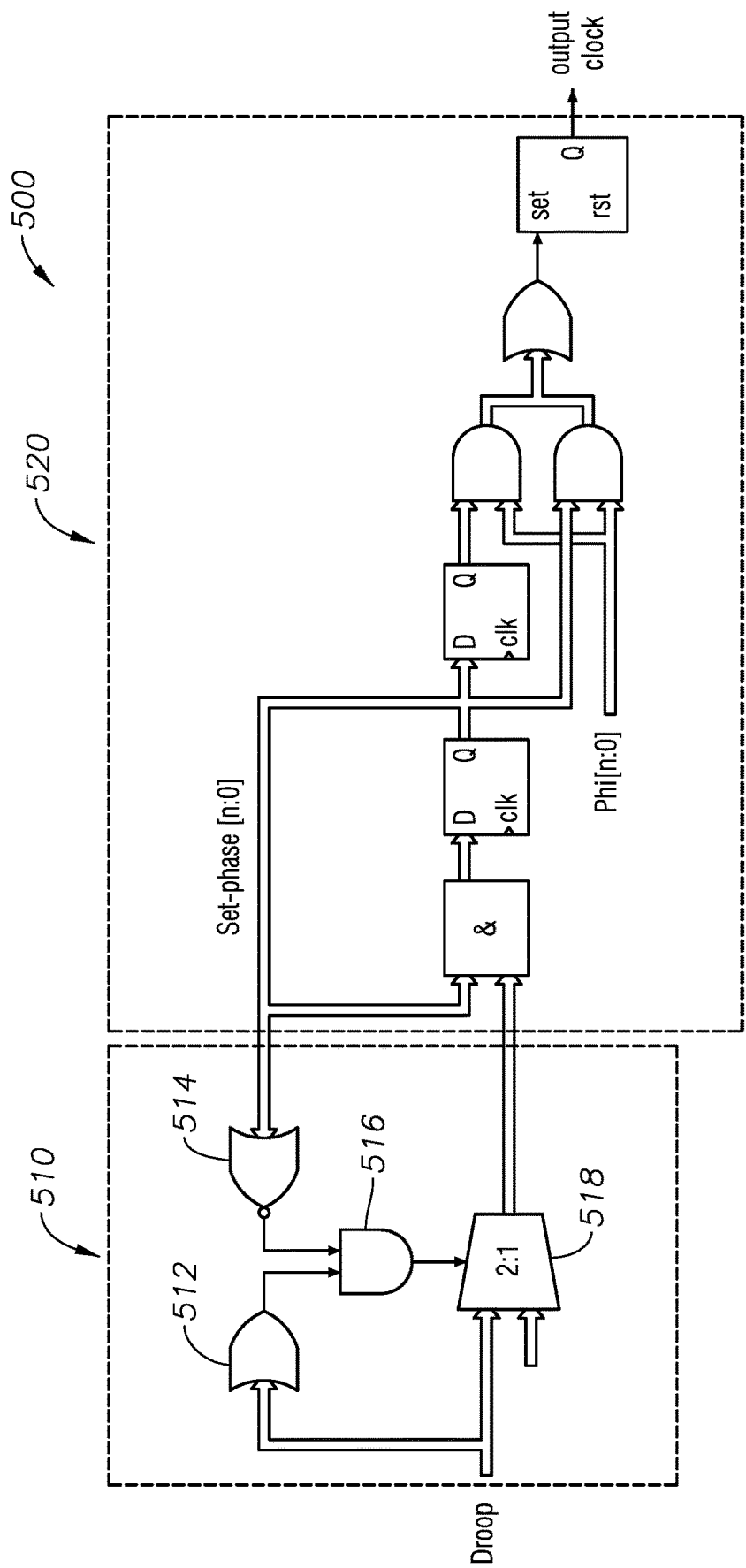
FIG. 5 is a schematic block diagram implementable with example circuits and methods.

Referring to FIG. 5, a diagram 500 corresponding to the diagram 400 in FIG. 4 according to example implementations is shown. In contrast, to FIG. 4, in FIG. 5, in one implementation, the decision block 412 is represented by an "OR" logic gate 512 and the decision block 414 is represented by a "NOR" logic gate 514. In alternative implementations, other equivalent circuit structures may be utilized for the decision blocks 412, 414. Hence, in a particular implementation, the speed controller circuit 510 (i.e., corresponding to the speed controller circuit 410), configured to determine the quietest phase of the multiphase clock group to be phase "0", can include: an OR logic gate 512, a NOR logic gate 514, an AND logic gate 516, and a multiplexer 518 (i.e., a controlled switch). In an alternative implementation, a look-up table may be utilized. A look-up table can be built from a "memory" type element, or multiplexers. Alternatively, any of the logic function as described herein can be built solely with NAND gates, or solely with NOR gates according to another implementation.

In certain implementations, the speed controller circuit 510 can be coupled to a set-path of the phase selector circuit 520 (i.e., corresponding to the phase selector circuit 420). As illustrated, the circuit elements of the phase selector circuit 520 may be similar to other examples.

In an example, a register transfer level (RTL) description of an speed controller circuit can include:

```
always@(d_fadc or d_bypass) begin
    if(d_bypass) phase_shift_speed <= 5'h00;
    else if(d_fadc[6]) phase_shift_speed <= 5'h07;
    else if(d_fadc[5]) phase_shift_speed <= 5'h06;
    else if(d_fadc[4]) phase_shift_speed <= 5'h05;
    else if(d_fadc[3]) phase_shift_speed <= 5'h04;
    else if(d_fadc[2]) phase_shift_speed <= 5'h03;
    else if(d_fadc[1]) phase_shift_speed <= 5'h02;
    else if(d_fadc[0]) phase_shift_speed <= 5'h01;
    else phase_shift_speed <= 5'h00;
end
```

In certain example implementations, an RTL description (i.e., RTL code) of the speed controller (350, 410, 510 as illustrated with reference to FIGS. 3, 4 and 5) according to example implementations includes:

```
assign low_noise_shift = ~mask_phi1[0];
always@(d_fadc or d_bypass or low_noise_shift) begin
    if(d_bypass) phase_shift_speed <= 5'h00;
    else if(d_fadc[6]) phase_shift_speed <= 5'h07;
    else if(d_fadc[5]) phase_shift_speed <= 5'h06;
    else if(d_fadc[4]) phase_shift_speed <= 5'h05;
    else if(d_fadc[3]) phase_shift_speed <= 5'h04;
    else if(d_fadc[2]) phase_shift_speed <= 5'h03;
    else if(d_fadc[1]) phase_shift_speed <= 5'h02;
    else if(d_fadc[0]) phase_shift_speed <= 5'h01;
    else if(low_noise_shift) phase_shift_speed <= 5'h01;
    else phase_shift_speed <= 5'h00;
end
```

Advantageously, the RTL code may be a description of a digital hardware circuit and can be synthetized (i.e., transformed) into a digital circuit that performs the same operation.

Figure 6:
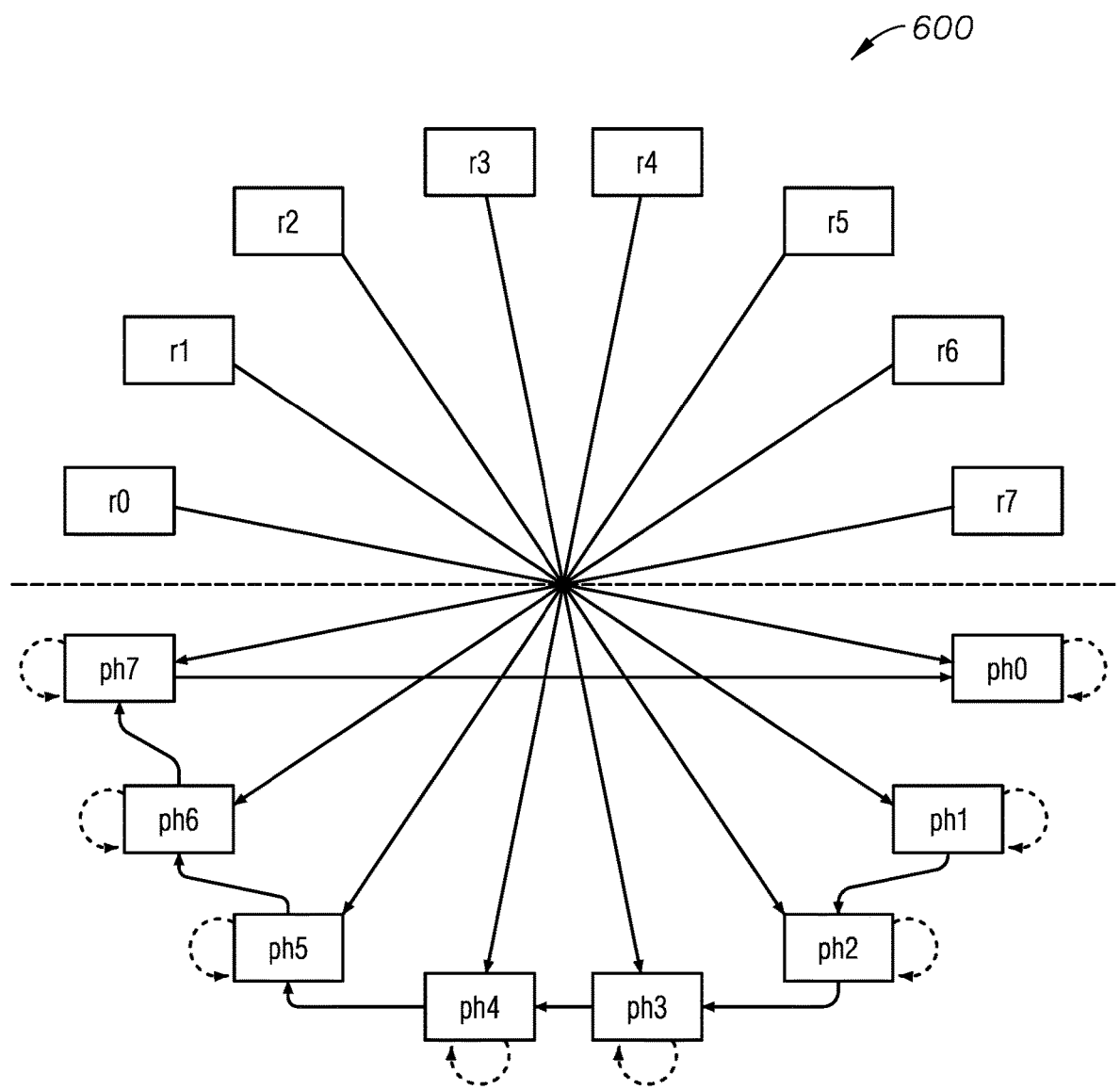
FIG. 6 is a schematic block diagram implementable with example circuits and methods.

Referring to FIG. 6, a diagram according to example implementations is shown. As illustrated, a state machine operation 600 of a phase selector circuit is depicted before and after certain inventive aspects as described herein. As illustrated, the state machine depicts an operation of the phase selector when no voltage droop has been detected. Accordingly, as shown, for example, eight different clocks are provided (ph0 to ph7) to trigger an adaptative clocking circuit. For instance, upon landing randomly on a particular phase (e.g., phase 3 as illustrated as ph3), without the benefit of the inventive aspects as described herein, the adaptive clocking circuit would remain on the same phase (e.g., ph3) (as shown by the dashed line for each phase). However, with implementation of the inventive circuits and methods as described herein, the adaptive clocking circuit would initially land on particular phase (e.g., ph3) and then, subsequently, shift phases in order (e.g., shift to ph4, then shift to ph5, then shift to ph6, then shift to ph7, then shift to ph0) until it reaches the least noisy phase (e.g., ph0) and would remain there (e.g., stay on ph0) (as shown by the solid lines for shifting from phase to phase) (i.e., incrementally altering the phase speed).

Figure 7:
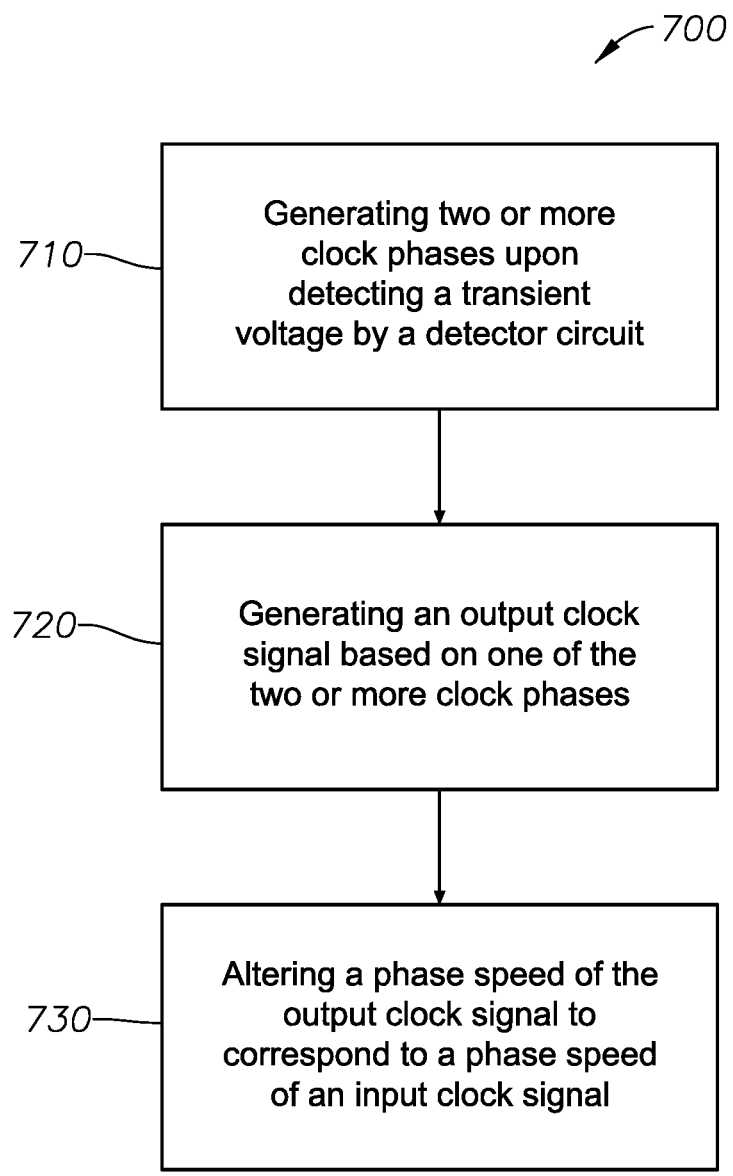
FIG. 7 is a flowchart of a particular illustrative aspect of example methods.

Referring to FIG. 7, a flowchart of an example method 700 (i.e., procedure) to reduce noise/clock jitter is shown. Advantageously, in various implementations, the method 700 depicts a methodology to generate a "stretched" output clock, and optimize for output clock jitter. The method 700 may be implemented with reference to circuit implementations and operations as depicted in FIGS. 1, 3, 4 and 5, and/or combinations thereof.

At block 710, the method includes upon detecting a transient voltage by a detector circuit, generating two or more clock phases. For instance, with reference to various implementations as described in with reference to FIGS. 1-6, upon detecting a transient voltage by a detector circuit (e.g., 120, 320), two or more clock phases (e.g., Ph[0] to Ph[7]; [m:0]) can be generated.

At block 720, the method includes generating an output clock signal based on one of the two or more clock phases. For instance, with reference to various implementations as described in with reference to FIGS. 1-6, an output clock signal (e.g., CPU_CLK, 172, 372) may be generated based on one of the two or more clock phases (e.g., Ph[0] to Ph[7]; [m:0]).

At block 730, the method includes altering a phase speed of the output clock signal to correspond to a phase speed of an input clock signal. For instance, with reference to various implementations as described in with reference to FIGS. 1-6, a phase speed of the output clock signal (e.g., CPU_CLK, 172, 372) may be altered (i.e., shifted) ((e.g., shifting from ph(3) to ph(4), then to ph(5), then to ph(6), then to ph(7), and then finally to ph(0)) to correspond to a phase speed (e.g., ph(0)) of an input clock signal (e.g., base clock 370).

Figure 8:
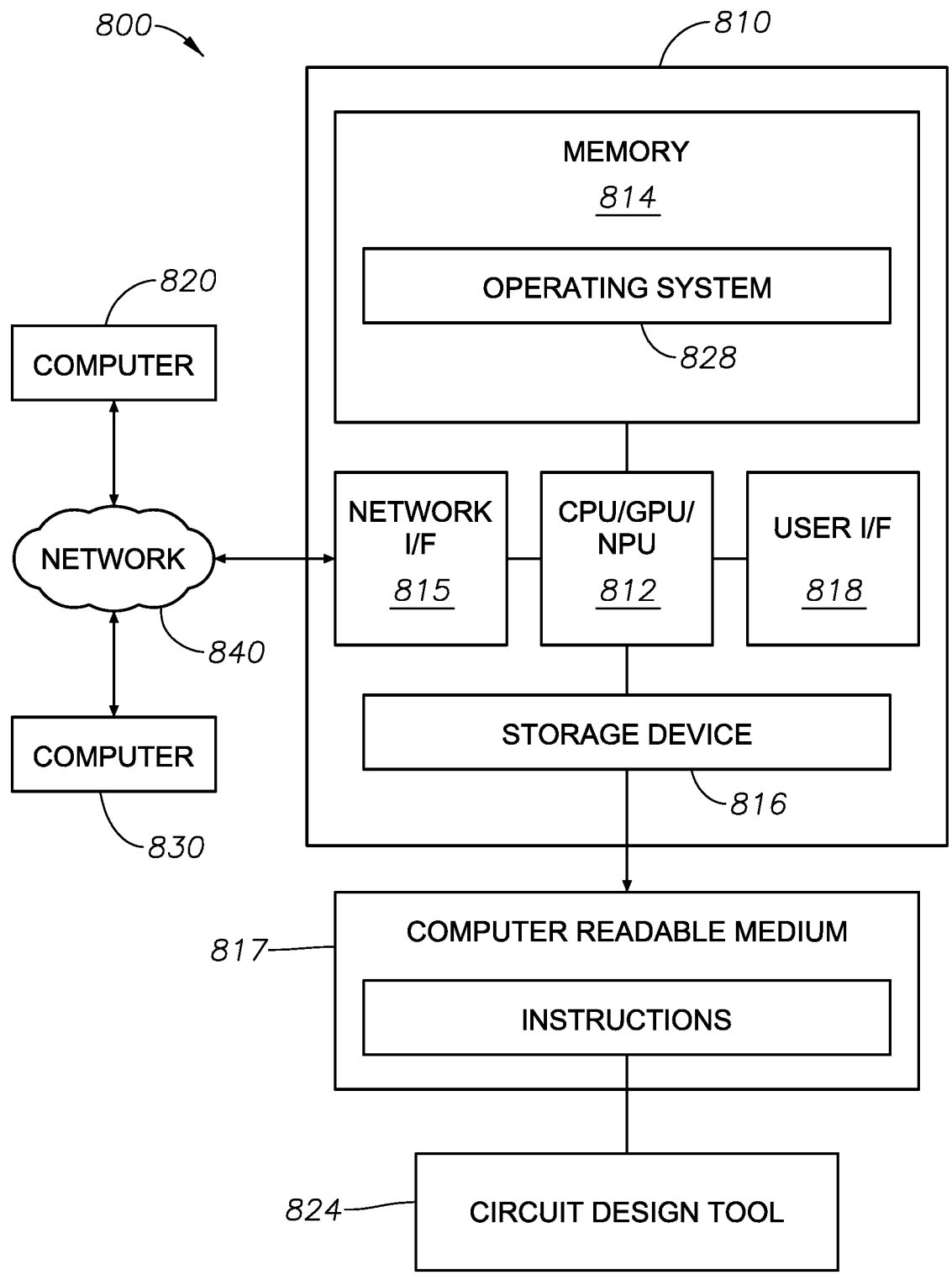
FIG. 8 is a schematic block diagram implementable with example circuits and methods.

FIG. 8 illustrates example hardware components in the computer system 800 that may be used to reduce noise clock jitter; and to generate a "stretched" output clock to optimize for jitter of the output clock. In certain implementations, the example computer system 800 (e.g., networked computer system and/or server) may include a circuit design tool 824 (i.e., an elective fine-grain adaptive clocking circuit design tool) and execute software based on the procedure as described with reference to the method 700 in FIG. 7. In certain implementations, the circuit design tool 824 may be included as a feature of an existing memory compiler software program.

In some cases, the circuit design tool 824 may provide generated computer-aided physical layout designs for memory architecture. The procedure (as described with reference to FIG. 7) may be stored as program code as instructions 817 in the computer readable medium of the storage device 816 (or alternatively, in memory 814) that may be executed by the computer 810, or networked computers 820, 830, other networked electronic devices (not shown) or a combination thereof. In certain implementations, each of the computers 810, 820, 830 may be any type of computer, computer system, or other programmable electronic device. Further, each of the computers 810, 820, 830 may be implemented using one or more networked computers, e.g., in a cluster or other distributed computing system.

In certain implementations, the system 800 may be used with semiconductor integrated circuit (IC) designs that contain all standard cells, all blocks or a mixture of standard cells and blocks. In a particular example implementation, the system 800 may include in its database structures: a collection of cell libraries, one or more technology files, a plurality of cell library format files, a set of top design format files, one or more Open Artwork System Interchange Standard (OASIS/OASIS.MASK) files, and/or at least one EDIF file. The database of the system 800 may be stored in one or more of memory 814 or storage devices 816 of computer 810 or in networked computers 820, 830.

The system 800 may perform the following functions automatically, with variable user input: generating two or more clock phases upon detecting a transient voltage by a detector circuit; generating an output clock signal based on one of the two or more clock phases; and altering (i.e., shifting) a phase speed of the output clock signal to correspond to a phase speed of an input clock signal. In some instances, such functions may be performed substantially via user input control. Additionally, such functions can be used in conjunction with the manual capabilities of the system 800 to produce the target results that are required by a designer.

In one implementation, the computer 800 includes a processing unit 812 having at least one hardware-based processor coupled to a memory 814. In certain implementations, the processing unit 812 may include one or more of a central processing unit (CPU), a graphical processing unit (GPU) or a neural processing unit (NPU). The memory 814 may represent random access memory (RAM) devices of main storage of the computer 810, supplemental levels of memory (e.g., cache memories, non-volatile or backup memories (e.g., programmable or flash memories)), read-only memories, or combinations thereof. In addition to the memory 814, the computer system 800 may include other memory located elsewhere in the computer 810, such as cache memory in the processing unit 812, as well as any storage capacity used as a virtual memory (e.g., as stored on a storage device 816 or on another computer coupled to the computer 810).

The computer 810 may further be configured to communicate information externally. To interface with a user or operator (e.g., a circuit design engineer), the computer 810 may include a user interface (I/F) 818 incorporating one or more user input devices (e.g., a keyboard, a mouse, a touchpad, and/or a microphone, among others) and a display (e.g., a monitor, a liquid crystal display (LCD) panel, light emitting diode (LED), display panel, and/or a speaker, among others). In other examples, user input may be received via another computer or terminal. Furthermore, the computer 810 may include a network interface (I/F) 815 which may be coupled to one or more networks 840 (e.g., a wireless network) to enable communication of information with other computers and electronic devices. The computer 860 may include analog and/or digital interfaces between the processing unit 812 and each of the components 814, 815, 816, and 818. Further, other non-limiting hardware environments may be used within the context of example implementations.

The computer 810 may operate under the control of an operating system 826 and may execute or otherwise rely upon various computer software applications, components, programs, objects, modules, data structures, etc. (such as the programs associated with the procedure 700 and related software). The operating system 828 may be stored in the memory 814. Operating systems include, but are not limited to, UNIX® (a registered trademark of The Open Group), Linux® (a registered trademark of Linus Torvalds), Windows® (a registered trademark of Microsoft Corporation, Redmond, Wash., United States), AIX® (a registered trademark of International Business Machines (IBM) Corp., Armonk, N.Y., United States) i5/OS® (a registered trademark of IBM Corp.), and others as will occur to those of skill in the art. The operating system 826 in the example of FIG. 8 is shown in the memory 814, but components of the aforementioned software may also, or in addition, be stored at non-volatile memory (e.g., on storage device 816 (data storage) and/or the non-volatile memory (not shown). Moreover, various applications, components, programs, objects, modules, etc. may also execute on one or more processors in another computer coupled to the computer 810 via the network 840 (e.g., in a distributed or client-server computing environment) where the processing to implement the functions of a computer program may be allocated to multiple computers 820, 830 over the network 840.

In example implementations, circuit diagrams and representations have been provided in FIGS. 1-8, whose redundant description has not been duplicated in the related description of analogous circuit diagrams and representations. It is expressly incorporated that the same layout diagrams with identical symbols and/or reference numerals are included in each of embodiments based on its corresponding figure(s).

Although one or more of FIGS. 1-8 may illustrate systems, apparatuses, or methods according to the teachings of the disclosure, the disclosure is not limited to these illustrated systems, apparatuses, or methods. One or more functions or components of any of FIGS. 1-8 as illustrated or described herein may be combined with one or more other portions of another of FIGS. 1-8. Accordingly, no single implementation described herein should be construed as limiting and implementations of the disclosure may be suitably combined without departing form the teachings of the disclosure.

Aspects of the present disclosure may be incorporated in a system, a method, and/or a computer program product. The computer program product may include a computer-readable storage medium (or media) having computer-readable program instructions thereon for causing a processor to carry out aspects of the present disclosure. The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire. For example, the memory 814, the storage device 816, or both, include tangible, non-transitory computer-readable media or storage devices.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some implementations, electronic circuitry including, for example, programmable logic circuitry, field-programmable gate arrays (FPGA), or programmable logic arrays (PLA) may execute the computer-readable program instructions by utilizing state information of the computer-readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general-purpose computer, a special purpose computer, or other programmable data processing apparatus to produce a machine, such that the instructions, which execute via the processor of the computer or other programmable data processing apparatus. The machine is an example of means for implementing the functions/acts specified in the flowchart and/or block diagrams. The computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the functions/acts specified in the flowchart and/or block diagrams.

The computer-readable program instructions may also be loaded onto a computer, other programmable data processing apparatus, or other device to cause a series of operational steps to be performed on the computer, other programmable apparatus or other device to perform a computer implemented process, such that the instructions which execute on the computer, other programmable apparatus, or other device implement the functions/acts specified in the flowchart and/or block diagrams.

The flowchart and block diagrams in the Figures illustrate the architecture, functionality, and operation of possible implementations of systems, methods, and computer program products according to various implementations of the present disclosure. In this regard, each block in the flowchart or block diagrams may represent a module, segment, or portion of instructions, which comprises one or more executable instructions for implementing the specified logical function(s). In some alternative implementations, the functions noted in a block in a diagram may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowcharts, and combinations of blocks in the block diagrams and/or flowcharts, can be implemented by special purpose hardware-based systems that perform the specified functions or acts or carry out combinations of special purpose hardware and computer instructions.

In the following description, numerous specific details are set forth to provide a thorough understanding of the disclosed concepts, which may be practiced without some or all of these particulars. In other instances, details of known devices and/or processes have been omitted to avoid unnecessarily obscuring the disclosure. While some concepts will be described in conjunction with specific examples, it will be understood that these examples are not intended to be limiting.

Unless otherwise indicated, the terms "first", "second", etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Reference herein to "one example" means that one or more feature, structure, or characteristic described in connection with the example is included in at least one implementation. The phrase "one example" in various places in the specification may or may not be referring to the same example.

Illustrative, non-exhaustive examples, which may or may not be claimed, of the subject matter according to the present disclosure are provided below. Different examples of the device(s) and method(s) disclosed herein include a variety of components, features, and functionalities. It should be understood that the various examples of the device(s) and method(s) disclosed herein may include any of the components, features, and functionalities of any of the other examples of the device(s) and method(s) disclosed herein in any combination, and all of such possibilities are intended to be within the scope of the present disclosure. Many modifications of examples set forth herein will come to mind to one skilled in the art to which the present disclosure pertains having the benefit of the teachings presented in the foregoing descriptions and the associated drawings.

Therefore, it is to be understood that the present disclosure is not to be limited to the specific examples illustrated and that modifications and other examples are intended to be included within the scope of the appended claims. Moreover, although the foregoing description and the associated drawings describe examples of the present disclosure in the context of certain illustrative combinations of elements and/or functions, it should be appreciated that different combinations of elements and/or functions may be provided by alternative implementations without departing from the scope of the appended claims. Accordingly, parenthetical reference numerals in the appended claims are presented for illustrative purposes only and are not intended to limit the scope of the claimed subject matter to the specific examples provided in the present disclosure.

What is claimed is:

1. A method comprising:
   upon detecting, by a detector circuit, a transient voltage, generating two or more clock phases;
   generating an output clock signal based on one of the two or more clock phases; and
   altering, by a speed controller circuit, a phase speed of the output clock signal to correspond to a phase speed of an input clock signal, wherein the speed controller circuit is configured to determine a quietest clock phase of the two or more clock phases.

2. The method of claim 1, wherein the phase speed is altered to reduce a phase noise of an output clock signal based on a phase noise of the input clock signal.

3. The method of claim 1, wherein the phase speed is altered to correspond to an approximate level of noise of an input clock signal.

4. The method of claim 1, wherein the phase speed of the output clock signal is altered based on determining the phase speed to be above a phase speed threshold.

5. The method of claim 4, wherein the phase speed threshold corresponds to a phase speed of the input clock signal.

6. The method of claim 1, wherein altering the phase speed comprises shifting from a first clock phase to a second clock phase, wherein the second clock phase comprises less noise than the first clock phase.

7. The method of claim 6, wherein the second clock phase comprises a least noisy clock phase.

8. The method of claim 6, wherein altering the phase speed comprises shifting from a second clock phase to a third clock phase, wherein the third clock phase comprises less noise than the second clock phase.

9. The method of claim 8, wherein the third clock phase comprises a least noisy clock phase.

10. The method of claim 1, wherein each of the plurality of clock phases corresponds to a different delays of a clock period.

11. The method of claim 1, wherein each of the plurality of clock phases is configured to initialize a leading edge of the output clock signal.

12. The method of claim 1, wherein the two or more clock phases comprises a plurality of clock phases of a multiphase clock grouping.

13. A circuit comprising:
    a detector circuit to monitor a supply voltage for a transient voltage;
    upon detection of the transient voltage, an input phase circuit configured to generate two or more clock phases;

a phase selector configured to generate an output clock signal from at least one of the two or more clock phases; and a speed controller circuit configured to alter a phase speed of the output clock signal to correspond to a phase speed of an input clock signal, wherein the speed controller circuit comprises: an OR logic gate, a NOR logic gate, an AND logic gate, and a multiplexer.

14. The circuit of claim 13, further comprising:

a phase-locked loop circuit configured to provide a base clock signal to the input phase circuit.

15. The circuit of claim 13, wherein the speed controller circuit is configured to determine whether an input signal from a detector circuit comprises a voltage level above a voltage threshold, and whether the phase speed is above a phase speed threshold.

16. The method of claim 13, wherein altering the phase speed comprises shifting from a first clock phase to a second clock phase, wherein the second clock phase comprises less noise than the first clock phase.

17. The method of claim 16, wherein the second clock phase comprises a least noisy clock phase.

18. A speed controller circuit comprising:

an OR logic gate;

a NOR logic gate;

an AND logic gate;

and a multiplexer, wherein the speed controller circuit is configured to determine whether an input signal from a detector circuit comprises a voltage level above a voltage threshold, and whether a selected phase speed is above a phase speed threshold.

19. The speed controller circuit of claim 18, wherein the speed controller circuit is configured to receive the input signal corresponding to a detection signal and a phase selection signal, and configured to transmit an output signal to verify a least noisy output clock.

* * * * *